United States Patent
Huang

(10) Patent No.: US 7,214,626 B2
(45) Date of Patent: May 8, 2007

(54) ETCHING PROCESS FOR DECREASING MASK DEFECT

(75) Inventor: Kao-Su Huang, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/161,960

(22) Filed: Aug. 24, 2005

(65) Prior Publication Data
US 2007/0049036 A1 Mar. 1, 2007

(51) Int. Cl.
*H01L 21/461* (2006.01)

(52) U.S. Cl. .................. 438/734; 438/717; 438/735; 438/736

(58) Field of Classification Search ............... 438/717, 438/736, 734–735, 706, 724
See application file for complete search history.

(56) References Cited

U.S. PATENT DOCUMENTS

2004/0038436 A1* 2/2004 Mori et al. ............... 438/17
2006/0205223 A1* 9/2006 Smayling ................. 438/725

* cited by examiner

*Primary Examiner*—Dung A. Le
(74) *Attorney, Agent, or Firm*—Winston Hsu

(57) ABSTRACT

The present invention provides an etching process for decreasing mask defect. The process comprises providing a substrate, and sequentially forming a thin film layer, a mask, and a photoresist on the surface of the substrate. Then the photoresist is trimmed by a bromide compound, and a first etching process is performed to transfer patterns from the photoresist to the mask. A strip process is performed to strip photoresist by mixing gases that include fluorine. Finally, a second etching process is performed to transfer the pattern from patterned mask to the thin film layer.

20 Claims, 10 Drawing Sheets

ETCHING PROCESS FOR DECREASING MASK DEFECT

BACKGROUND OF THE INVENTION

1. Field of the Invention

The invention relates to etching process for decreasing mask defect, and more particularly, to etching process which can completely clean a photoresist.

2. Description of the Prior Art

Along with continuously reducing line widths of semiconductor elements, the size of each element of MOS transistors continues to be miniaturized. However, exposure machine, etching machine, and photosensitive material limits the line widths of a semiconductor element so that the development of smaller line widths experiences a bottleneck, especially in the same etching reaction chamber named an in-situ etching process. Therefore, it is important to determine how to decrease a mask defect and improve etching accuracy in the latter etching process.

Please to refer to FIG. 1 and FIG. 2 that are schematic diagrams for defining the gate pattern of a MOS transistor according to prior art. As shown in FIG. 1, a gate oxide layer 12 is formed on a silicon substrate 10, and a doped polysilicon layer 14, a silicon nitride compound mask 16, and a bottom anti-reflection coating (BARC) layer 18 are sequentially formed on the gate oxide layer 12. Finally, a photoresist layer 20 is formed on the BARC 18.

A photolithographic process is performed to define the gate pattern on the photoresist layer 20. Then, an anisotropic etching process is performed, such as utilizing dry etching to remove the BARC 18 and portions of the mask 16 not covered by the patterned photoresist layer 20 to transfer the pattern from the photoresist layer 20 to the mask 16. Employing an in-situ etcher or etching system, the photoresist layer 20 is removed. Utilizing the mask 16 as a hard mask in the etching process, the doped polysilicon layer 14 is etched down to the surface of the gate oxide layer 12 to form the polysilicon pattern, as shown in FIG. 2.

However, the above-described prior art method still has shortcomings. When using a smaller than 90 nm process, the above-described in-suit etching process cannot completely remove the photoresist layer. Today's pure $O_2$ strip processes will produce halogenated compound polymers formed by F, HBr, Cl, etc. from the etching mask 16 and the photoresist 20 during the process. The halogenated compound polymers causes hard mask defects in later etching of the doped polysilicon layer 14 and influences the accuracy of the mask 16, seriously affecting the quality of the latter etching process.

Therefore, the applicant proposes a method of reducing mask defects to prevent above-described problems.

SUMMARY OF THE INVENTION

It is therefore a primary objective of the claimed invention to provide an etching process for decreasing mask defect to solve the above-mentioned problems.

According to the claimed invention, etching process for decreasing mask defect includes providing a substrate, and sequentially forming a thin film layer, a mask, and a photoresist on the surface of the substrate. Then a bromide compound trims the photoresist, and a first etching process is performed to transfer patterns from the photoresist to the mask. A strip process is performed to strip the photoresist by mixing gases that include fluorine. Finally, a second etching process is performed to transfer the pattern from patterned mask to the thin film layer.

It is an advantage of the claimed invention that the etching process for decreasing mask defect utilizes a bromide compound to trim the patterned photoresist, and uses mixed gases including fluorine to strip the photoresist so that the method can completely remove the photoresist and prevent halogenated compound polymers from remaining on the mask. The process can enhance the quality of the latter process and decrease the cost.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
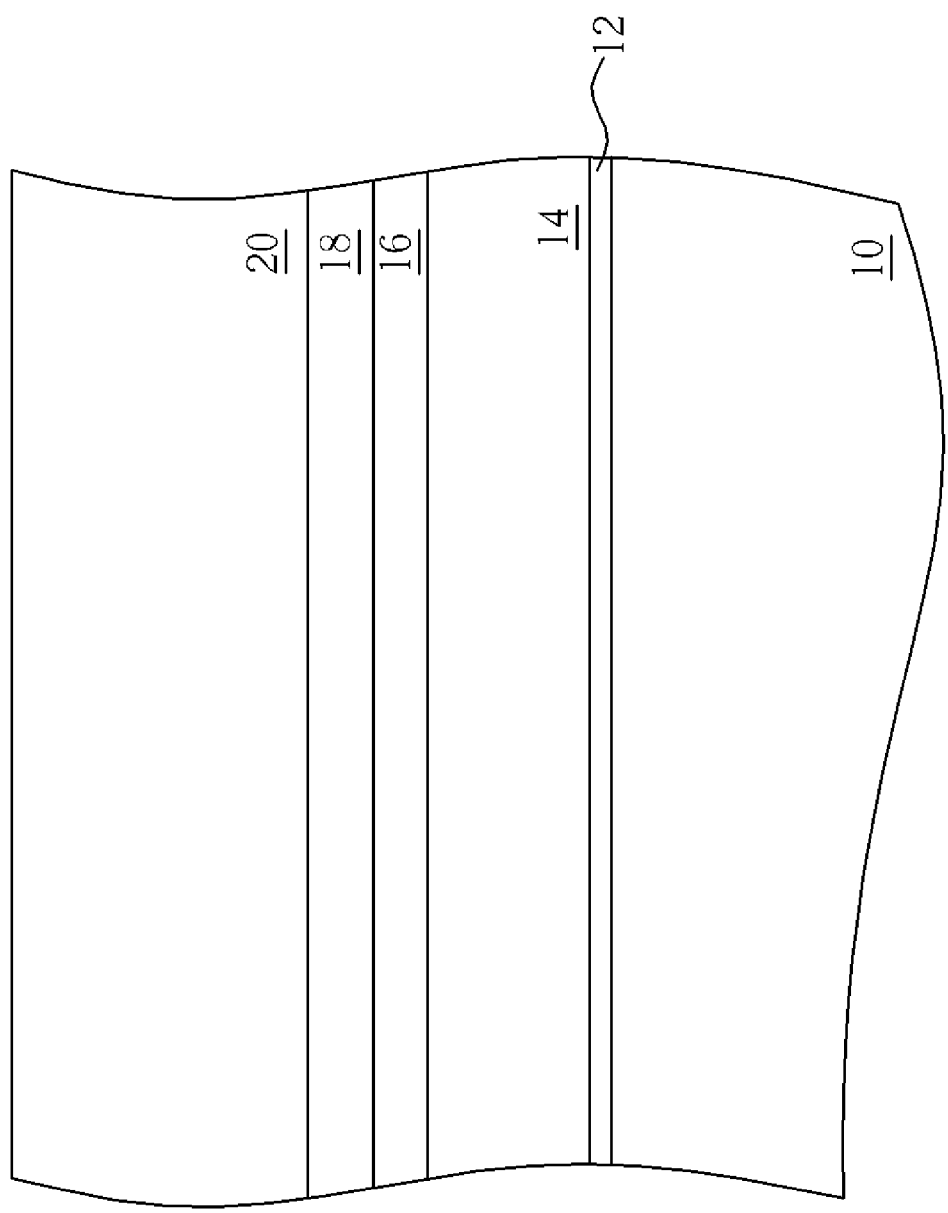
FIG. 1 and FIG. 2 are schematic diagrams for defining a gate pattern of a MOS transistor according to prior art.
Figure 2:
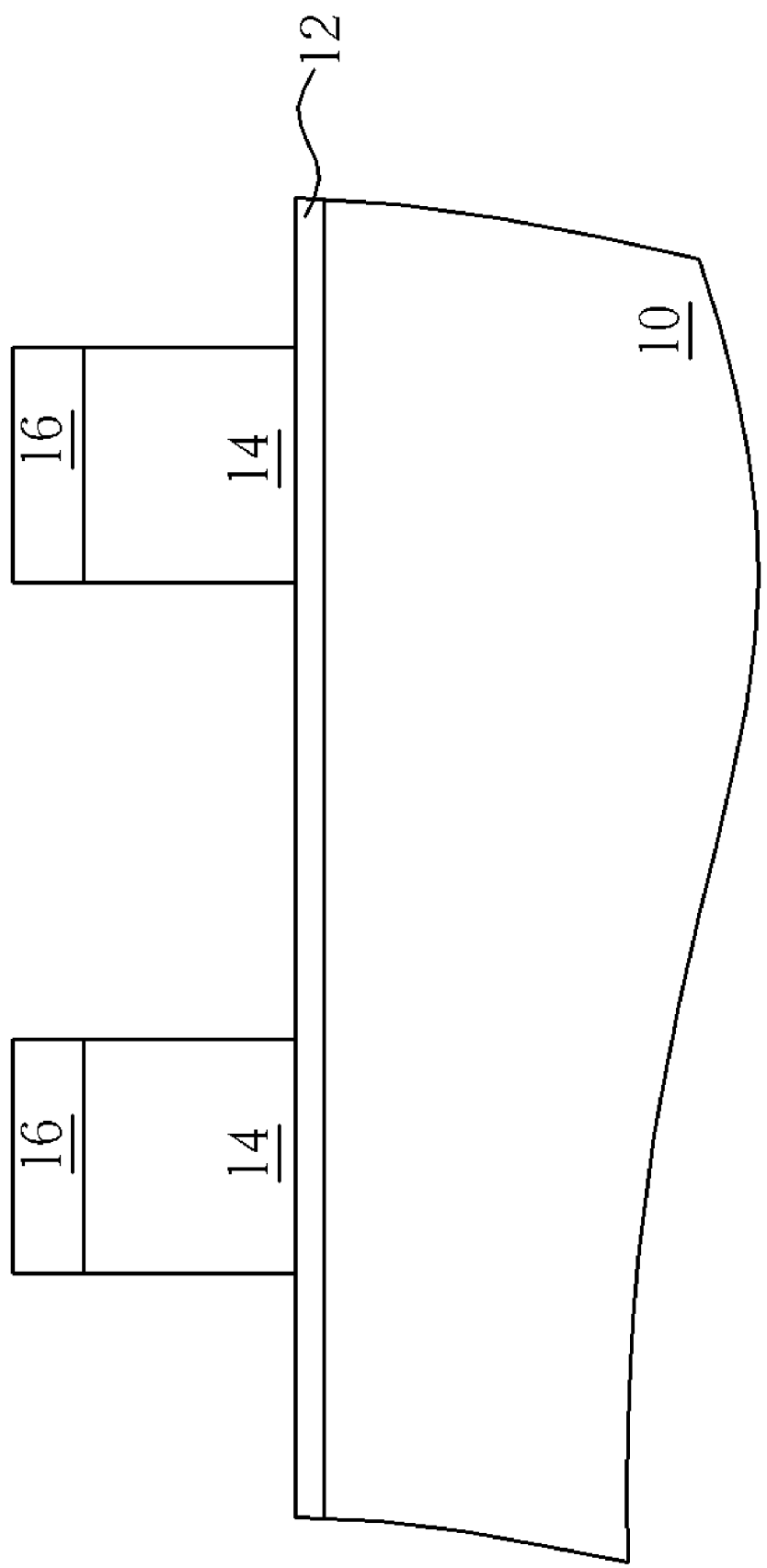
Figure 3:
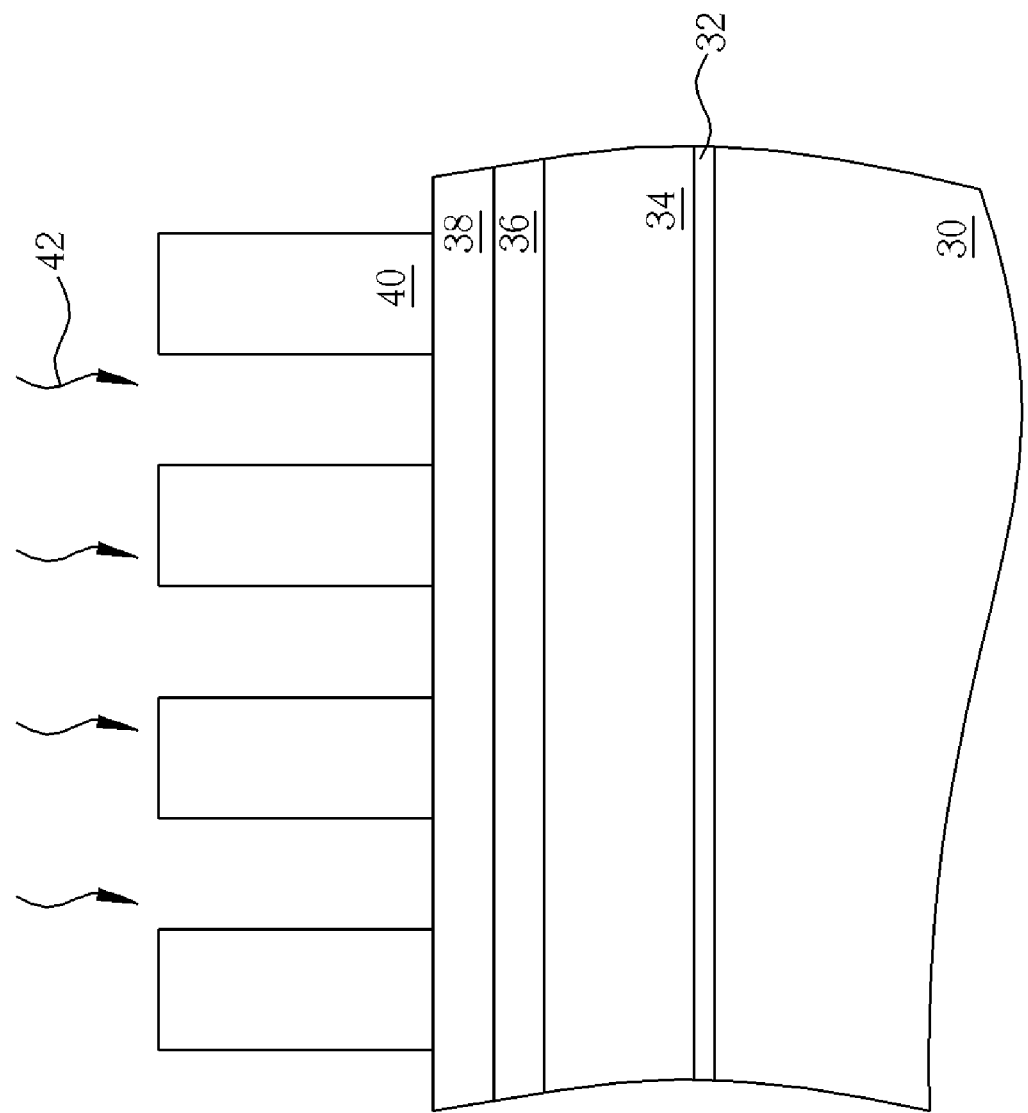
FIG. 3 to FIG. 6 are schematic diagrams for manufacturing a gate pattern of a hard mask according to the present invention.

The present invention etching process is applied in a two-stage pattern transfer in the manufacture of the integrated circuits. Please refer to FIG. 3 to FIG. 6 that are schematic diagrams for manufacturing a gate pattern of a hard mask according to present invention. As shown in FIG. 3, the present invention provides a substrate 30, such as a silicon substrate, and sequentially forms a gate oxide layer 32, a polysilicon layer 34, a mask 36, a bottom anti-reflection coating (BARC) 38, and a patterned photoresist 40. The mask 36 can be a silicon oxide compounds layer, silicon nitride compounds, a dielectric layer, or a metal layer. The BARC 38 can be silicon oxide nitride compounds, and can be regarded to selectively deposited under the photoresist 40, but presence or absence of the BARC 38 layer is subject to design considerations. In addition, the patterned photoresist 40 has been exposed and developed in a photolithographic process, and is trimmed or cured by utilizing a boron compound 42, such as HBr, $HBr_2$, or $HBr_x$.

Figure 4:
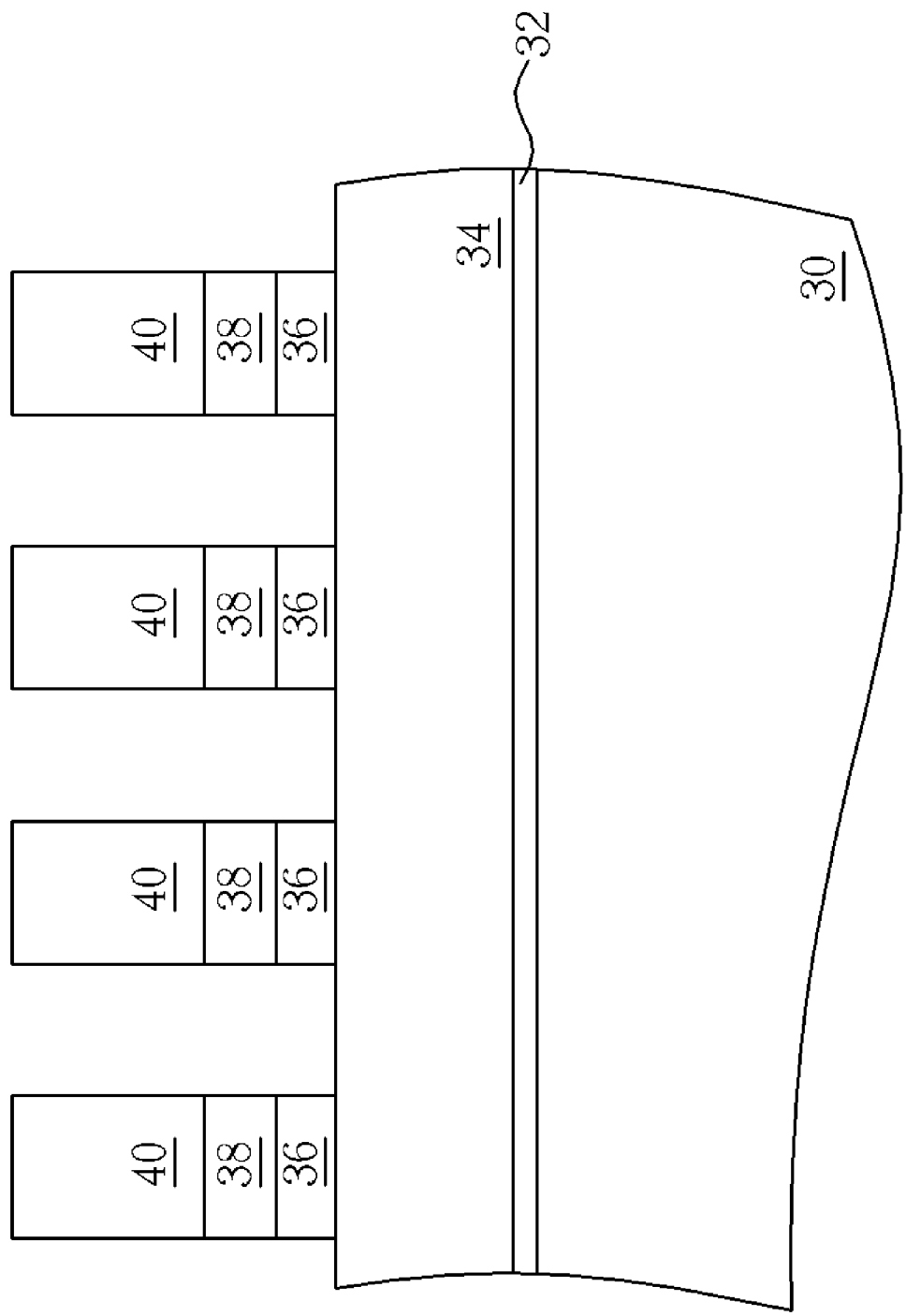
Figure 5:
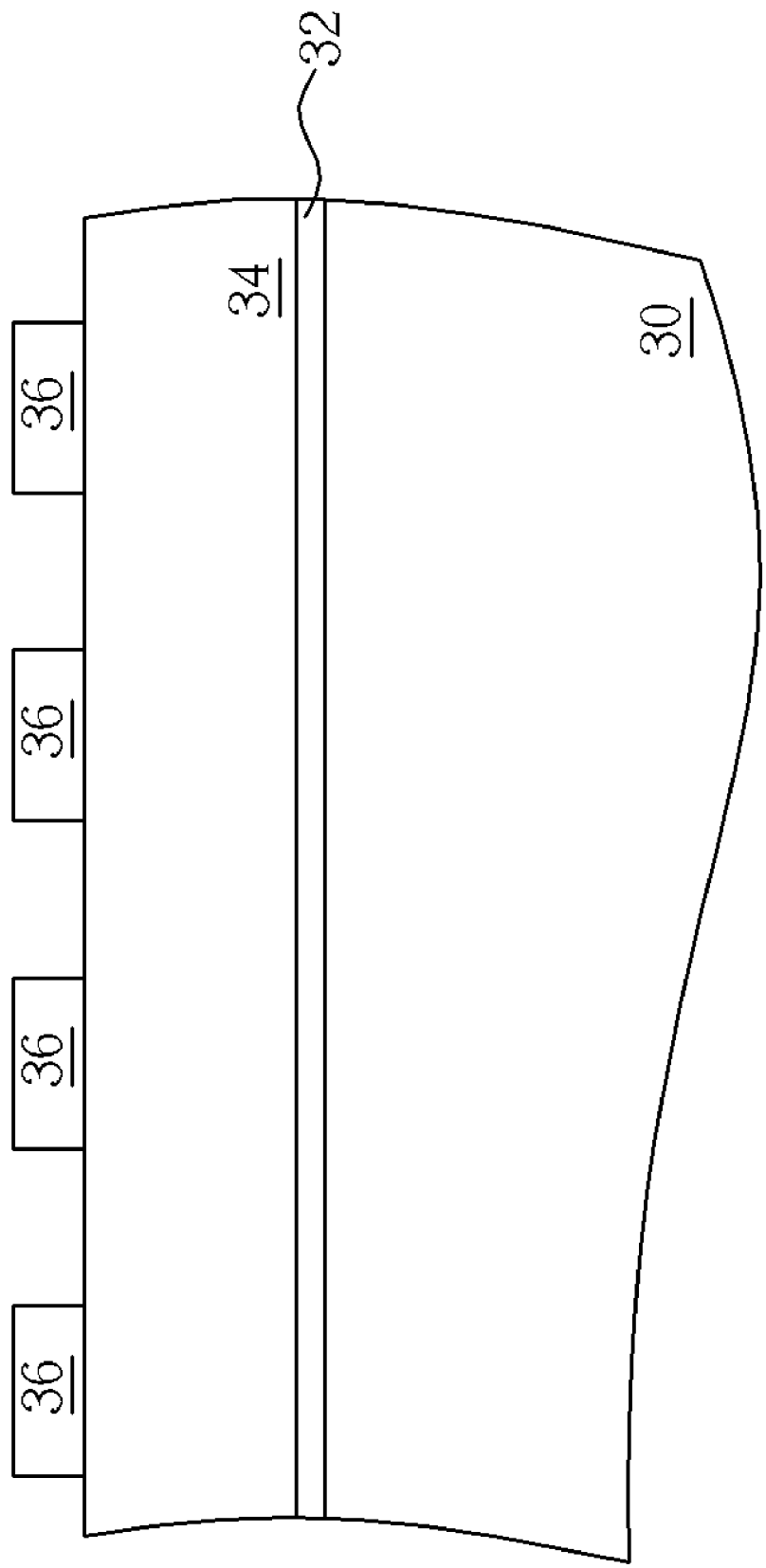
Figure 6:
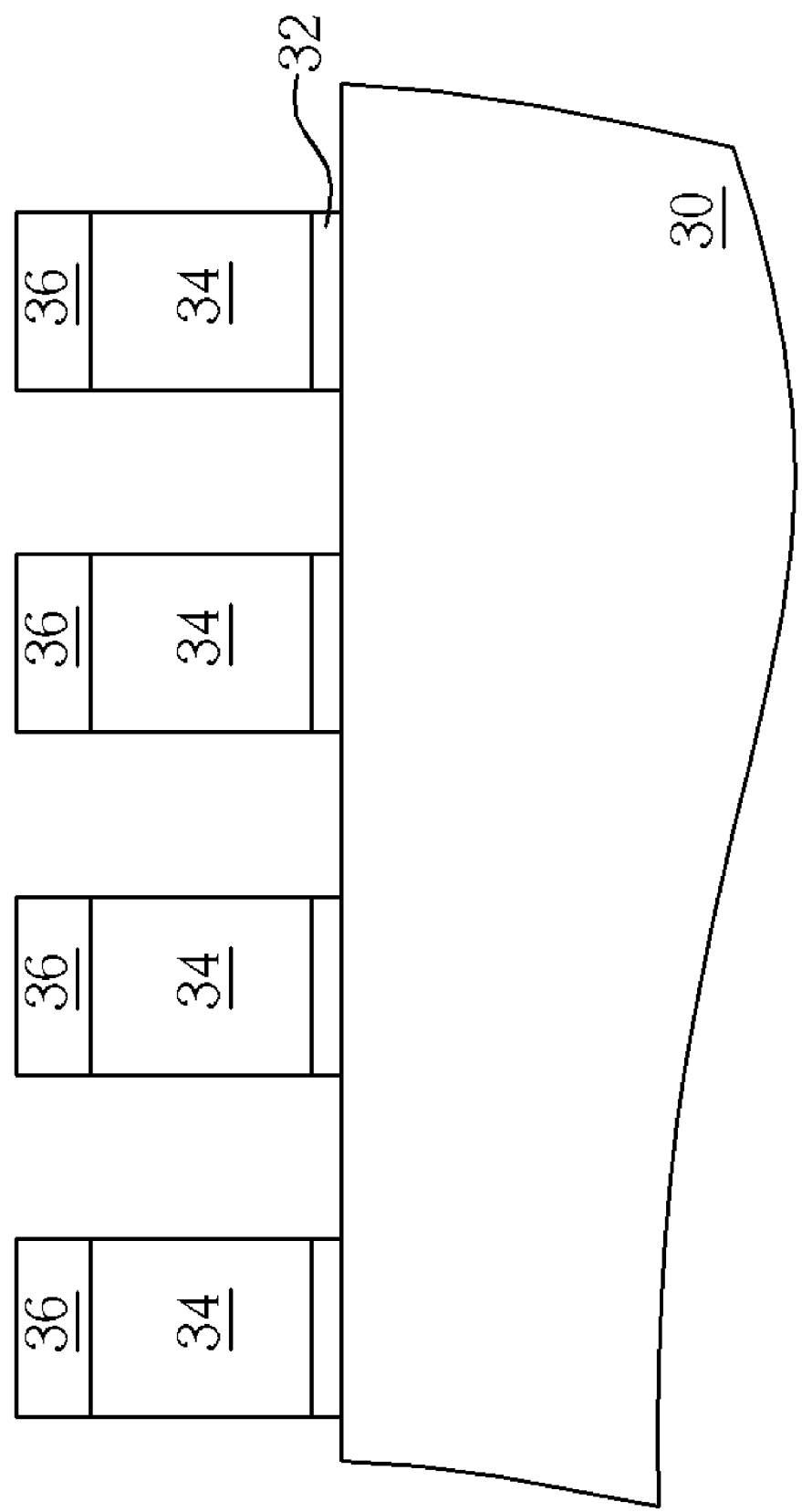

Then etching process is performed in the same reaction chamber as above process. As shown in FIG. 4, first an etching process is performed to etch the BARC 38 and the mask 36 not covered by patterned photoresist 40. As shown in FIG. 5, mixing gases comprising fluorine, such as mixing gases also comprising oxygen ($O_2$) and fluorocarbon ($C_xF_y$), or also comprising mixing gases of oxygen ($O_2$) and fluorosulfur ($S_xF_y$) are utilized in the reaction chamber to strip the photoresist 40 and the BARC 38, exposing the patterned mask 36 remaining on the surface of the polysilicon 34 to be used as a hard mask of the polysilicon 34 and gate oxide layer 32. As shown in FIG. 6, another etching process is performed in the same reaction chamber to etch the polysilicon 34 down to the surface of the substrate 30 by utilizing the mask 36 as the hard mask for the polysilicon 34, or to etch the polysilicon 34 and gate oxide layer 32 down to the surface of the substrate 30. In addition, the trimming process by the bromide compound and the striping photoresist process are performed in the reaction chamber, named an in-situ etching process.

It is noted that the bromide compound, such as HBr, $HBr_2$, or $HBr_x$, is used to trim or cure the photoresist 40. Therefore, the mixing gases comprising fluorine, such as mixing gases also comprising oxygen ($O_2$) and fluorocarbon ($C_xF_y$), or mixing gases also comprising oxygen ($O_2$) and fluorosulfur ($S_xF_y$), are utilized in an in-situ etching reaction chamber to strip the photoresist 40 according to the present invention. The invention solves the prior art problem that the photoresist cannot be completely removed using an in-situ etching process, etcher, or etching system, and therefore prevents hard mask defects previously formed by F, HBr, Cl . . . halogenated compounds polymers. The results of experiment show that when the process is smaller than a 90 nm process, the mixing gases of oxygen ($O_2$) and tetafluoromethane ($CF_4$) are used about 60~100 seconds in the photoresist strip process, and the yield after etching can be substantially enhanced to 99.9%.

Figure 7:
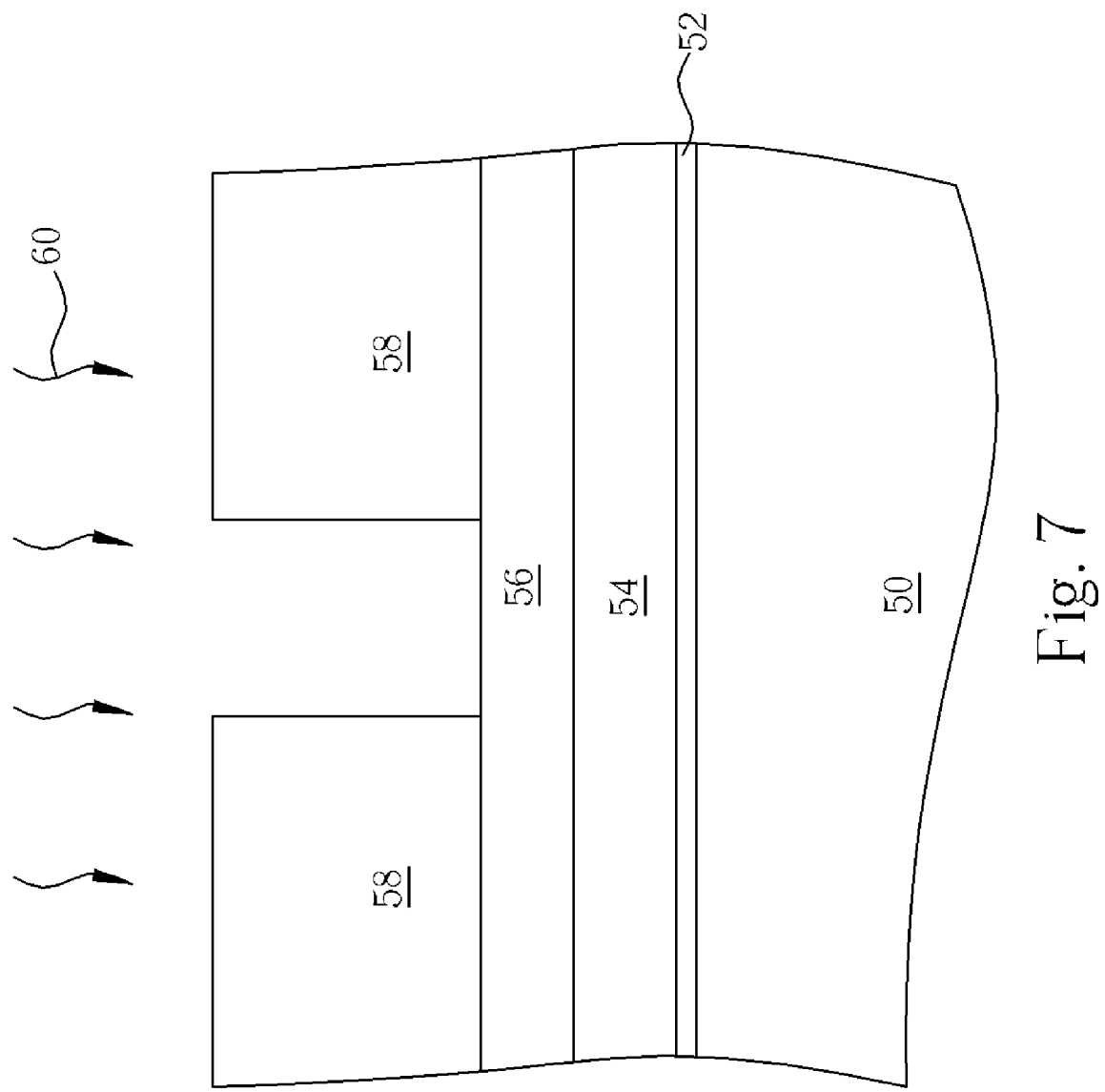
FIG. 7 to FIG. 10 are schematic diagrams for manufacturing a hard mask of shallow trench isolation according to the present invention.

The present invention can additionally be applied to other in-situ etching processes. Please refer to FIG. 7 to FIG. 10 that are schematic diagrams for manufacturing a hard mask of shallow trench isolation (STI) according to the present invention. As shown in FIG. 7, the present invention provides a substrate 50, such as silicon substrate, and sequentially forms a pad oxide layer 52, a silicon nitride compounds layer 54, a BARC 56, and a patterned photoresist 58 on the surface of the substrate. The BARC 56 can be silicon oxide nitride compounds, and can be regarded to selectively deposited under the photoresist 58 according to design considerations. In addition, the patterned photoresist 58 has been exposed and developed in a photolithographic process, and is trimmed or cured utilizing a bromide compound 60 such as HBr, $HBr_2$, or $HBr_x$.

Figure 8:
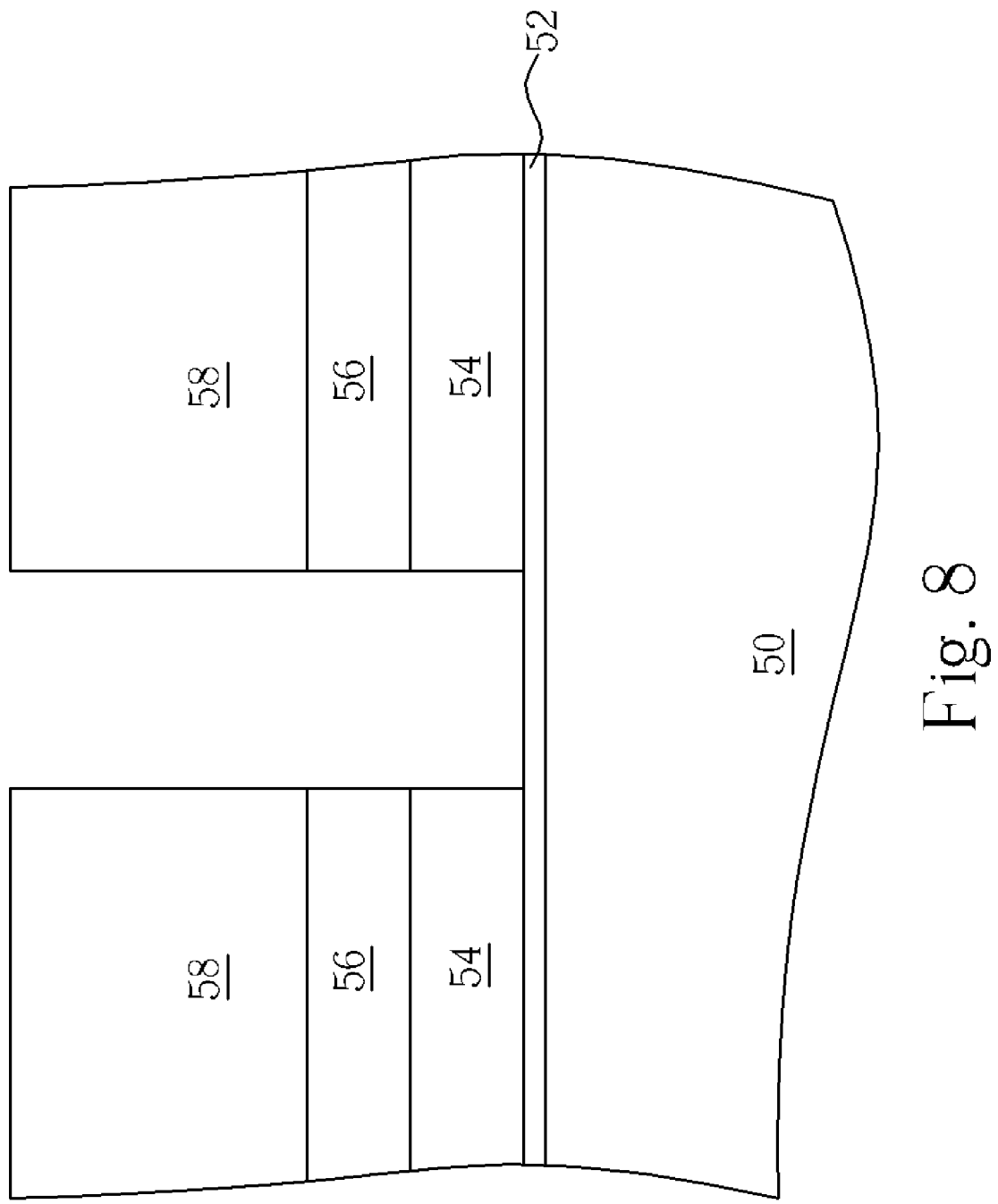
Figure 9:
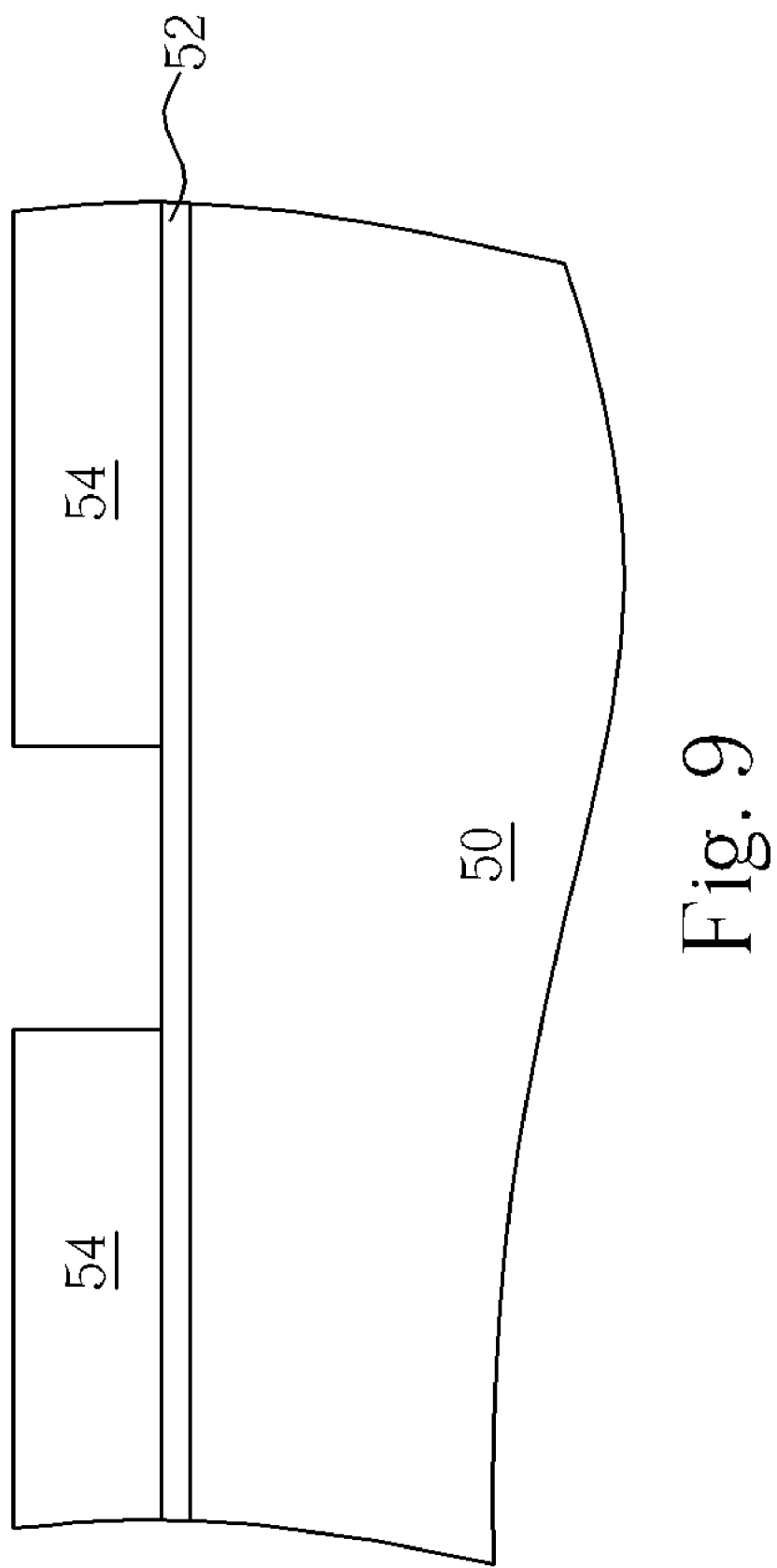
Figure 10:
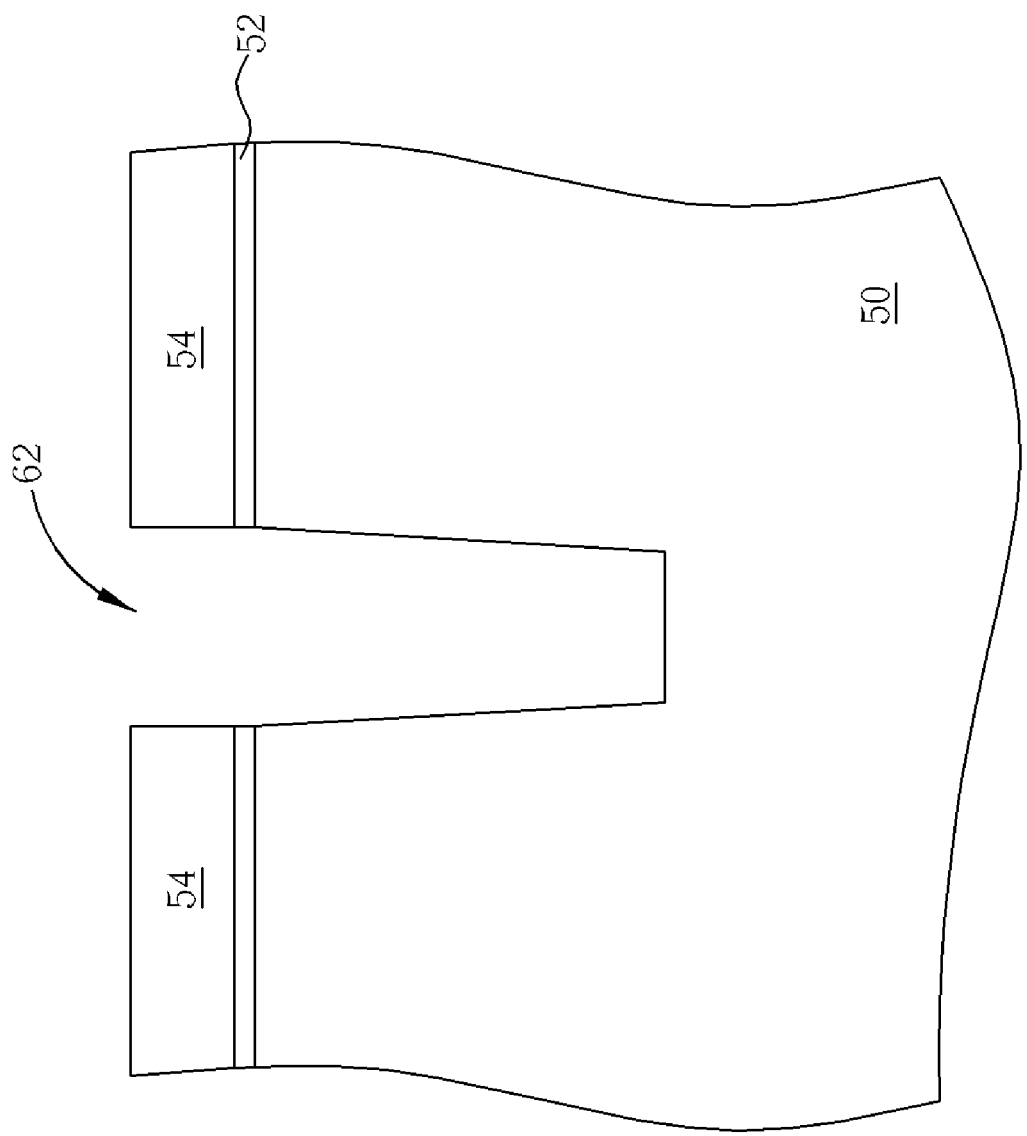

Then, an etching process is performed in the same reaction chamber as above process. As shown in FIG. 8, first an etching process is performed to etch the BARC 56 and the silicon nitride layer 54 not covered by the patterned photoresist 58. As shown in FIG. 9, then a strip process is performed to strip the photoresist 58 and the BARC 56 utilizing mixing gases comprising fluorine, such as mixing gases also comprising oxygen ($O_2$) and fluorocarbon ($C_xF_y$), or mixing gases also comprising oxygen ($O_2$) and fluorosulfur ($S_xF_y$), so as to use the silicon nitride layer 54 as a hard mask of the STI. As shown in FIG. 10, another etching process is performed to etch the pad oxide layer 52 and a portion of the substrate 50 to form SIT 62. In addition, the trimming process by the bromide compound and the striping photoresist process are performed in the reaction chamber, named an in-situ etching process.

A bromide compounds, such as HBr, $HBr_2$, or $HBr_x$, is used to trim or cure the photoresist 58. Therefore, the mixing gases comprising fluorine, such as mixing gases also comprising oxygen ($O_2$) and fluorocarbon ($C_xF_y$), or mixing gases also comprising oxygen ($O_2$) and fluorosulfur ($S_xF_y$), are utilized in an in-situ etching reaction chamber to strip photoresist 58 according to the present invention. The invention can effectively solve the prior art problems of hard mask defects and enhance the yield of the in-situ etching process.

To sum up, the present invention can effectively solve problems that the photoresist cannot be completely removed using an in-situ etching process, etcher, or etching system of prior art, and substantially avoids the hard mask defects formed by halogenated compound polymers in the trimming or curing of the photoresist process. In addition, the present invention method of decreasing hard mask defects can not only be applied to the above-described manufacturing of a hard mask for a polysilicon gate and an STI, but also can used for a hard mask in any trimming or curing photoresist process, two stages mask process, and metal conducting wire process.

When compared to prior art, the present invention decreases mask defects by utilizing a bromide compound to trim or cure photoresist, and a mixing gases comprising fluorine to etch the mask. Not only can the method decrease mask defects, but also it also accurately orientates structures in latter etching processes to enhance the quality and yield of product, and decrease cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A hard mask etching process free from halogenated compound polymer residue, the process comprising:
   providing a substrate and sequentially forming a thin film layer, a mask, and a patterned photoresist on the substrate;
   trimming the patterned photoresist by a bromide compound in a chamber;
   performing a first etching process to transfer the pattern from the photoresist to the mask;
   removing halogenated compound polymers in-situ in said chamber; and
   performing a second etching process to transfer the pattern from the patterned mask to the thin film layer.

2. The process of claim 1, wherein the step of removing halogenated compound polymers further comprising simultaneously striping the photoresist.

3. The process of claim 1, wherein the substrate is a silicon substrate and the thin film layer is a polysilicon layer.

4. The process of claim 3, wherein a gate oxide layer is formed between the polysilicon layer and the silicon substrate.

5. The process of claim 1, wherein a bottom anti-reflection layer is formed between the mask and the patterned photoresist.

6. The process of claim 1, wherein the bromide compound is utilized in a trimming or curing photoresist process.

7. The process of claim 6, wherein the bromide compound comprises HBr, $HBr_2$, or $HBr_x$.

8. The process of claim 1, wherein the mask comprises an oxide silicon compounds layer, nitride silicon compounds layer, metal, or dielectric layer.

9. The process of claim 1, wherein the halogenated compound polymers are removed by a mixing gas comprising oxygen ($O_2$) and fluorocarbon ($C_xF_y$), or oxygen ($O_2$) and fluorosulfur ($S_xF_y$).

10. The process of claim 9, wherein the fluorocarbon is tetafluoromethane, and the duration of the strip photoresist process is 60~100 seconds.

11. A hard mask etching process free from halogenated compound polymer residue, the process comprising:
    providing a substrate, and sequentially forming a mask and a patterned photoresist on the substrate;
    trimming the patterned photoresist by a bromide compound in a chamber;
    performing a first etching process to transfer the pattern from the photoresist to the mask;
    removing halogenated compound polymers in-situ in said chamber; and
    performing a second etching process to transfer the pattern from the patterned mask to the substrate.

12. The process of claim 11, wherein the step of removing halogenated compound polymers further comprising simultaneously striping the photoresist.

13. The process of claim 11, wherein the substrate is a silicon substrate.

14. The process of claim 11, wherein a bottom anti-reflection layer is formed between the mask and the patterned photoresist.

15. The process of claim 11, wherein the mask is a nitride silicon compounds layer.

16. The process of claim 15, wherein a pad oxide layer is formed between the mask and substrate.

17. The process of claim 11, wherein the bromide compound is used to trim or cure photoresist.

18. The process of claim 17, wherein the bromide compound comprises $HBr$, $HBr_2$, or $HBr_x$.

19. The process of claim 11, wherein the halogenated compound polymers are removed by a mixing gas comprising oxygen ($O_2$) and fluorocarbon ($C_xF_y$), or oxygen ($O_2$) and fluorosulfur ($S_xF_y$).

20. The process of claim 19, wherein the fluorocarbon is tetafluoromethane, and the duration of the strip photoresist process is 60~100 seconds.

* * * * *